(12) United States Patent
Aubourg

(10) Patent No.: US 7,796,701 B2
(45) Date of Patent: Sep. 14, 2010

(54) DIGITAL DECODER FOR A DIGITAL WIRELESS TRANSMISSION SYSTEM USING A SPACE-TIME LINEAR CODE

(75) Inventor: Etienne Aubourg, Paris (FR)

(73) Assignee: COMSIS, Paris (FR)

( * ) Notice: Subject to any disclaimer, the term of this patent is extended or adjusted under 35 U.S.C. 154(b) by 757 days.

(21) Appl. No.: 11/630,627

(22) PCT Filed: Jun. 9, 2005

(86) PCT No.: PCT/FR2005/001423
§ 371 (c)(1),
(2), (4) Date: Dec. 22, 2006

(87) PCT Pub. No.: WO2006/008359
PCT Pub. Date: Jan. 26, 2006

(65) Prior Publication Data
US 2009/0180577 A1 Jul. 16, 2009

(30) Foreign Application Priority Data
Jun. 23, 2004 (FR) .................................. 04 06810

(51) Int. Cl.
*H04L 23/02* (2006.01)
(52) U.S. Cl. .................................................... 375/262
(58) Field of Classification Search .................. 375/262, 375/267, 340, 341, 285, 347; 370/203, 332, 370/341, 354, 329
See application file for complete search history.

(56) References Cited

U.S. PATENT DOCUMENTS

| 6,862,552 B2 * | 3/2005 | Goldstein et al. ............ 702/179 |
| 7,372,919 B1 * | 5/2008 | Lou et al. ...................... 375/329 |
| 2002/0054650 A1 | 5/2002 | Alamouti et al. |
| 2002/0122502 A1 * | 9/2002 | El-Gamal et al. ........... 375/267 |

FOREIGN PATENT DOCUMENTS

WO WO 03/107582 A2 12/2003

OTHER PUBLICATIONS

Bon-Jin Ku et al., Iterative Decoding of Serially Concatenated Space-Time Codes in WCDMA Systems, Proc. Military Communications Conference Milcom 2002, New York, New York, IEEE, US, vol. 1 of 2, Oct. 7, 2002, pp. 911-916.
Gaspa J R, Space-time Coding for UMTS. Performance Evaluation in Combination with Convolutional and Turbo Coding, Proc. IEEE Vehicular Technology Conference Fall 2000, vol. 1, Sep. 24, 2000, pp. 92-98.
Guixia Kan et al., The Decision Schemes on the Concatenation of Space-Time Block Code and Convolutional Code in WCDMA System, Proc. of 2001 International Conference on Info-Tec and Info-Net, Beijing, China. vol. 2, Oct. 29, 2001, pp. 693-697.

* cited by examiner

Primary Examiner—Khai Tran
(74) Attorney, Agent, or Firm—Greer, Burns & Crain, Ltd.

(57) ABSTRACT

A digital decoder for a transmitting and receiving-multi-antenna digital wireless transmission chain for determining symbols transmitted in linear space-time coded transmission signals based on a convolutional binary coding, the digital decoder being fed by: —a received symbols signal vector Z, and a matrix C resulting from the product of a transmission channel matrix H and a space-time coding matrix M for the transmission including: a comprehensive space-time decoder for calculating the metric between each possible codeword and the received symbols signal vector Z, and for generating as output all the metrics thus calculated; and a binary decoder for determining, by using all the metrics generated as probabilities of transitions between states of the binary decoder, the most probable path taken during the convolutional coding, and for deducing from these the symbols transmitted.

12 Claims, 4 Drawing Sheets

DIGITAL DECODER FOR A DIGITAL WIRELESS TRANSMISSION SYSTEM USING A SPACE-TIME LINEAR CODE

BACKGROUND

This invention relates to a digital decoder for a transmitting-and-receiving-multi-antenna digital wireless transmission chain. This digital decoder is intended to determine symbols transmitted in linear space-time coded transmission signals, based on a convolutional binary coding.

The invention is particularly useful for application in the field of transmission or radio broadcasting of digital data, in particular in the case of transmission with mobiles or, in a more general manner, in the case of wireless or hard-wired networks. In a more precise manner, the invention applies advantageously in the context of the IEEE standards 802.11a and IEEE 802.11g when, on transmission, the signal has been subjected to a linear space-time coding based on binary coding. As a reminder, the standard specifies only a binary coding.

In a general manner, systems combining a multiplicity of antennas for transmission and reception, or MIMO (Multiple Input, Multiple Output) systems make it possible to increase the capacity and reliability of transmission chains, in particular by using space-time coding. This space-time coding makes it possible to transmit successive symbols via the plurality of transmission antennas on sending. On reception, there are numerous detectors implementing reception algorithms such as, in particular, linear receivers based on the setting to zero criterion or minimising the mean squared error. This invention relates rather to algorithms based on maximum likelihood, which authorize best performance in terms of error rate. However, standard receivers based on such an algorithm present major complexity from the point of view of design.

SUMMARY

The purpose of this invention is therefore a novel high performance digital decoder, in particular high-speed and compact, for which the design is simplified. At least one of the aforementioned objectives is achieved with a digital decoder for a transmitting-and-receiving-multi-antenna digital wireless transmission chain. This digital decoder is capable of determining symbols sent in linear space-time coded transmission signals, based on a convolutional binary coding. It is supplied by:

a received symbols signal vector Z,
a matrix C resulting from the product of a transmission channel matrix H and a space-time coding matrix N for the transmission.

According to the invention, this digital decoder comprises a combination of:

a comprehensive space-time decoder to calculate the metric between each possible codeword and the received symbols signal vector Z, and
a binary decoder to determine, by using said metrics as probabilities of transitions between the states of the binary decoder, the most probable path taken during the convolutional coding, and to deduce from these the symbols transmitted.

A decoder is termed "comprehensive" when it handles all possible codewords.

With the system according to the invention, a space-time decoder is combined with a binary decoder, the binary decoder being adapted as a function of the number and coding of the metrics calculated within the space-time decoder.

Of course, on transmission, a binary coder produces a space-time coding adapted to the digital decoder according to this invention. Preferably, the convolutional binary coding includes 64 states.

According to one advantageous characteristic of the invention, the space-time decoder comprises means for calculating all the metrics by successive groups, the metrics for each group being calculated in parallel and then transmitted in parallel to the binary decoder at each clock cycle. The space-time decoder thus has a pipeline architecture. This architecture makes it possible to guarantee optimum performances at each moment and operation in real time without using buffer memory.

By way of example, if each possible codeword comprises eight bits $(b_0 b_1 b_2 b_3 b_4 b_5 b_6 b_7)$, the 256 possible metrics are determined by calculating sixteen groups of sixteen metrics, each according to the following definition (Definition of a Euclidean distance):

$$\text{metric } (b_0 b_1 b_2 b_3 b_4 b_5 b_6 b_7) = \sum_{j=1}^{4} \left\| Z_j - \sum_{k=1}^{4} [(-1)^{b_{2k-2}} + i(-1)^{b_{2k-1}}] C_{jk} \right\|^2$$

Advantageously, in order to calculate the metrics, the space-time decoder comprises:

four identical modules named "Diff-compo" to calculate in parallel and in a sequential manner four values $D_j$ defined by:

$$D_j(\text{State}) = C_{j1}((-1)^{\overline{State0}} + i(-1)^{\overline{State1}}) + C_{j2}((-1)^{\overline{State2}} + i(-1) - Z_j, j \in \{1,2,3,4\},$$

with State=$(b_0 b_1 b_2 b_3)$;

sixteen modules named "Bitslice" to calculate in parallel and in a sequential manner sixteen metrics, each metric then being defined by:

$$M_x(\text{State}) = \sum_{j=1}^{4} \| D_j(\text{State}) + C_{j3}((-1)^{\overline{x0}} + i(-1)^{\overline{x1}}) + C_{j4}((-1)^{\overline{x2}} + i(-1)^{\overline{x3}}) \|^2$$

with X being equal to $(b_4 b_5 b_6 b_7)$. Moreover, X indexes each "Bitslice" module.

The fact of performing pipeline calculations by groups of 16×16 in particular, allows a better size/power compromise.

Preferably, the space-time decoder also comprises a controller to manage the synchronisation between the space-time decoder and the binary decoder, and to generate the State signal. In order to do this, the controller uses a clock signal.

According to one preferred embodiment of the invention, the binary decoder is implemented using a Viterbi algorithm with flexible input and hard output. This produces an assembly between a comprehensive space-time decoder and an adapted Viterbi decoder. According to the invention, this binary decoder can comprise a metrics management module to receive continuously all the metrics originating from the space-time decoder, to store these metrics, and to extract preliminary decisions from them.

Moreover, the binary decoder comprises a decision management module to receive said preliminary decisions, to store these preliminary decisions, and to deduce from them final decoding decisions.

Although the Viterbi decoder is used in the usual manner to take decisions concerning all the received symbols, in this case, in the decoder according to the invention, the space-time decoder does a part of the work by determining the possible metrics from which the Viterbi decoder will take these decisions, which limits the calculations and therefore improves the speed of processing.

Advantageously, the digital decoder according to the invention can be implemented on a programmable integrated circuit of the FPGA type, the calculations being executed in a synchronous manner using registers. The different modules of the digital decoder are thus integrated into a matrix architecture.

The digital decoder according to the invention is preferably adapted for a transmission chain comprising two antennas for transmission and two antennas for reception and for a transmission speed of 24 Mbits per second.

BRIEF DESCRIPTION OF THE DRAWINGS

Other characteristics and advantages of the invention will become apparent from the description hereafter. The attached drawings are given by way of non-limitative examples.

DETAILED DESCRIPTION OF THE PREFERRED EMBODIMENT

There will now be described a digital decoder of a digital wireless transmission chain using a 2×2 linear space-time code over a QPSK (Quaternary Phase Shift Keying) binary coding base. This coding is defined as a function F of two bits:

$$F(b_0,b_1)=(-1)^{b_0}+i(-1)^{b_1}$$

However, other forms of coding such as 16QAM or 64QAM can be used.

Figure 1:
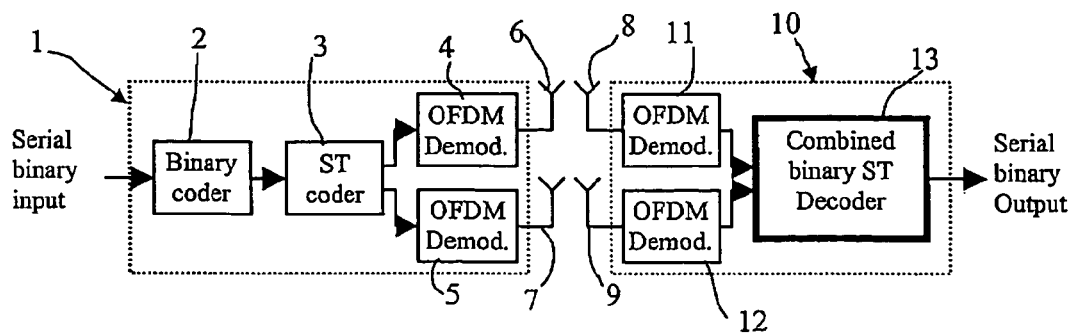
FIG. 1 is a general diagrammatic view of a wireless digital transmission chain according to the invention.

The transmission chain is based on the IEEE 802.11a standard, with two transmission antennas and two reception antennas. The convolutional code used is that defined by the standard. FIG. 1 shows such a transmission chain according to the invention. The signal to be transmitted supplies, in the form of a binary series, a binary coder 2 contained in a transmitter 1. This signal is then coded by the space-time coder 3, then modulated by the modulators 4, 5 before being transmitted by the two transmission antennas 6 and 7. The modulation can be of the OFDM (Orthogonal Frequency Division Multiplex) type. On receipt, the two antennas 8 and 9 transmit the captured signals to two OFDM demodulators 11 and 12. The digital decoder 13 according to the invention recovers all signals originating from the demodulators 11 and 12 and processes them so as to retrieve the original series binary signal.

In a general manner, the structure of the space-time coding is of the following form:

$$\begin{array}{c c} & \text{Time1} \quad\quad\quad \text{Time2} \\ \text{Antenna1} & \left[ \begin{array}{cc} Y_1(S_1,S_2,S_3,S_4) Y_2(S_1,S_2,S_3,S_4) \\ Y_1(S_1,S_2,S_3,S_4) Y_2(S_1,S_2,S_3,S_4) \end{array} \right] \\ \text{Antenna2} & \end{array}$$

with the $Y_j$: complex linear functions of $(S_1, S_2, S_3, S_4)$, QPSK symbols.

$$\begin{cases} S_1 = |b_0 b_1|_2 \\ S_2 = |b_2 b_3|_2 \\ S_3 = |b_4 b_5|_2 \\ S_4 = |b_6 b_7|_2 \end{cases}$$

The $Y_j$ symbols transmitted in the form of a column vector are then written as:

$$\begin{bmatrix} Y_1 \\ Y_2 \\ Y_3 \\ Y_4 \end{bmatrix} = N \cdot \begin{bmatrix} S_1 \\ S_2 \\ S_3 \\ S_4 \end{bmatrix}$$

With N a 4×4 matrix derived from the space-time code. The received symbols $Z_j$ are of the form:

$$\begin{bmatrix} Z_1 \\ Z_2 \\ Z_3 \\ Z_4 \end{bmatrix} = HN \cdot \begin{bmatrix} S_1 \\ S_2 \\ S_3 \\ S_4 \end{bmatrix} + w$$

With H the 4×4 channel matrix and w the noise. Let C be the 4×4 matrix such that C=HN. The matrices Z and C are the input data to the digital decoder 13. The symbols $S_1$, $S_2$, $S_3$ and $S_4$, are to be retrieved, i.e. eight bits $(b_0 b_1 b_2 b_3 b_4 b_5 b_6 b_7)$ to be determined, thus 256 ($2^8$) possible codewords.

Figure 2:
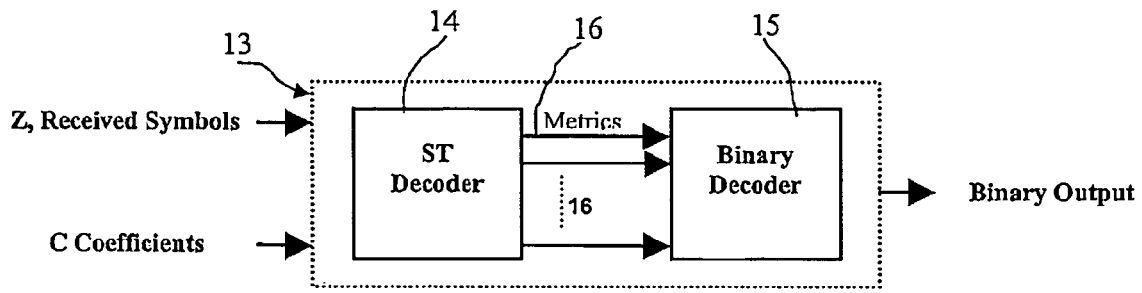
FIG. 2 is a general diagrammatic view of a digital decoder according to the invention.

In FIG. 2 the general diagram of the digital decoder is shown which receives as input the complex coefficients of the matrix C taking into account the distortions of the transmission channel, as well as the received symbols Z. As output, the digital decoder provides a serial binary flow of the decoded data. It comprises two processing modules organized sequentially:

the space-time decoder (ST) 14 which is responsible for calculating the metrics 16 between the 256 possible codewords and the received symbols, the binary decoder 15 which deduces from the calculated metrics the most probable path taken during the convolutional coding.

From the symbol received and the coefficients C, the decoder ST 14 calculates the 256 metrics for each group of sixteen. Each group of sixteen metrics is sent to the binary decoding block 15. The binary decoder output is a flow of decoded bits in series.

Figure 3:
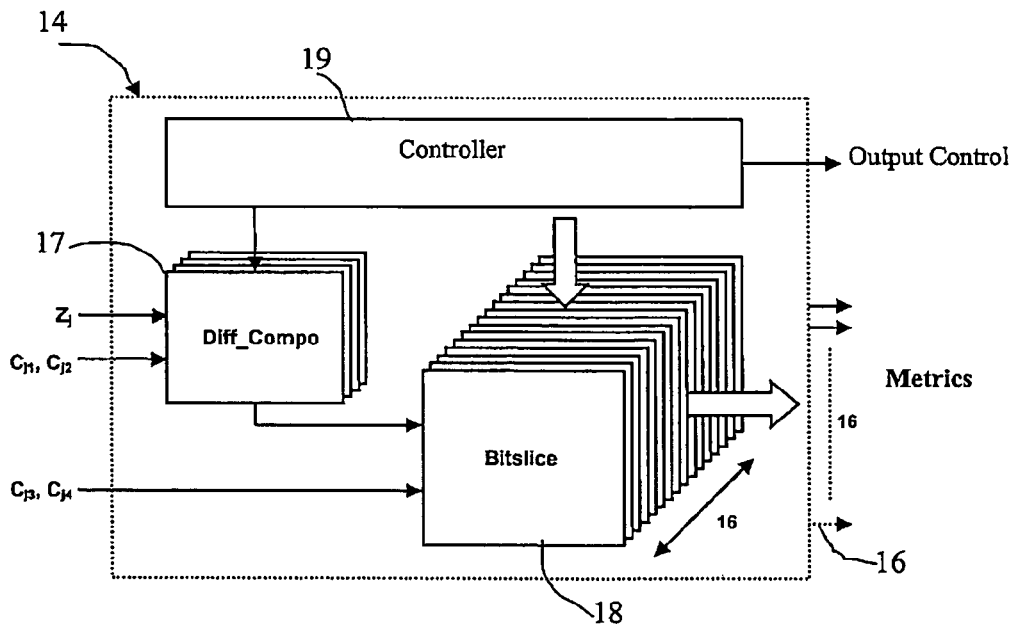
FIG. 3 is a diagrammatic view of a space-time decoder integrated into the digital decoder according to the invention.
Figure 4:
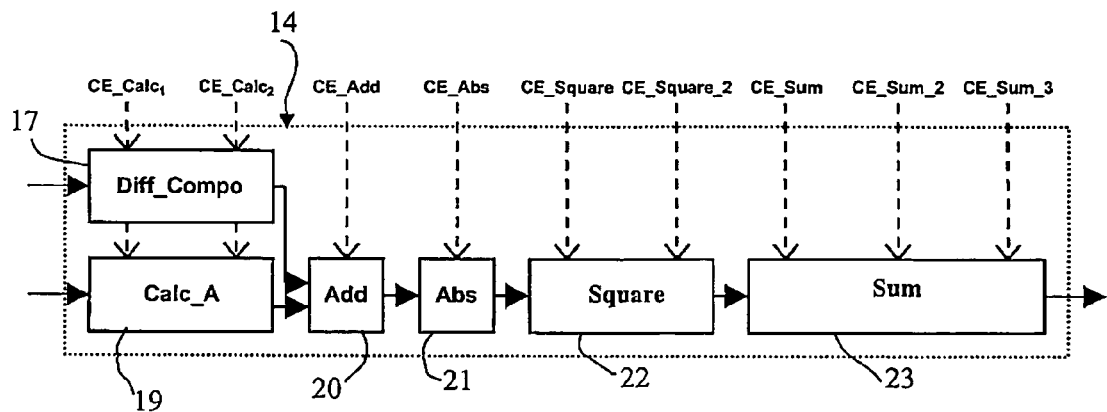
FIG. 4 is another simplified diagrammatic view of the space-time decoder showing a diagram of the calculation timings.

The principle of the space-time decoder 14 is as illustrated in FIGS. 3 and 4. More precisely, it is presented as follows:

it involves calculating for each of the combinations of eight bits ($b_0 b_1 b_2 b_3 b_4 b_5 b_6 b_7$) the metric defined by the following equation:

$$M = \sum_{j=1}^{4} \left\| Z_j - \sum_{k=1}^{4} \left[ (-1)^{b_{2k-2}} + i(-1)^{b_{2k-1}} \right] C_{jk} \right\|^2$$

These 256 metrics are calculated in pipeline sixteen states from sixteen parallel calculations, i.e. sixteen metrics are calculated simultaneously with each clock cycle. To do this, a variable "State"=$(S_1, S_2)$=$(b_0 b_1 b_2 b_3)$ is defined as being the state of the pipeline and a variable "X"=$(b_4 b_5 b_6 b_7)$ as being the number of the parallel calculation. This definition of variables allows a segregation between the elements using the coefficients $C_{j3}, C_{j4}$ and dependants of X ($S_3$ and $S_4$), and the other elements using $C_{j1}, C_{j2}$ with State ($S_1$ and $S_2$). Thus, in the metrics calculation, the members causing action by the elements $C_{j1}, C_{j2}$ and which are independent of $S_3$ and $S_4$, are calculated outside the pipeline and are expressed in the form:

$D_j(\text{State}) = \underline{C_{j1}}((-1)^{\overline{State0}} + i(-1)^{\overline{State1}}) + C_{j2}((-1)^{\overline{State2}} + i(-1)^{\overline{State3}}) - Z_j, j \in \{1,2,3,4\}$, The four values $D_j$ are calculated by four identical modules 17, named "Diff_compo". Then the pipeline consists of sixteen modules 18 named "Bitslice" in order to calculate sixteen metrics in parallel in a synchronous manner. Each Bitslice module 18 receives the four values $D_j$ as well as the four values $C_{j3}$ and the four values $C_{j4}$. X makes it possible to index each Bitslice module 18. The calculation of the metric $M_x$ is as follows:

$M_x(\text{State}) =$ $$\sum_{j=1}^{4} \left\| D_j(\text{State}) + C_{j3}((-1)^{\overline{x_0}} + i(-1)^{\overline{x_1}}) + C_{j4}((-1)^{\overline{x_2}} + i(-1)^{\overline{x_3}}) \right\|^2$$

This calculation is carried out in five successive steps, as can be seen specifically in FIG. 4 with blocks 19 to 23:

calculation 19 by the component A of $C_{j3}$ and $C_{j4}$, as a function of X, sum 20 of $D_j$ and the preceding results, calculation 21 of the absolute value of this sum, raising 22 to the square of the preceding absolute value and series 23 of sums to determine the metric.

This breakdown of the calculation according to the "X" and "State" values can save space during the hardware implementation.

Figure 5:
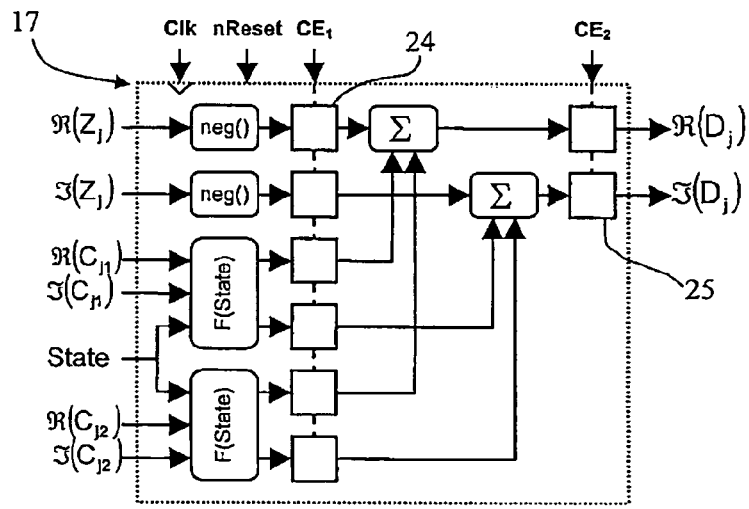
FIG. 5 is an internal diagrammatic view of the "Diff_compo" module from FIG. 3.

FIG. 3 also shows a controller 19 intended to manage synchronisation with the binary decoder 15 and to transmit the "State" signal to the four identical "Diff_compo" modules 17 using different input data. A "Diff_compo" module is depicted in more detail in FIG. 5. The calculations are carried out in a synchronous manner using control signals CE (for "Clock Enable"), in this case $CE_1$ and $CE_2$, transmitted by the controller 19 to registers 24 and 25 placed upstream and downstream of the modules carrying out the addition function. Depending on the input variable "State", the "Diff_compo" module generates a real part and an imaginary part of $D_j$.

The pipeline consists of sixteen "Bitslice" modules 18 provided to carry out sequentially sixteen calculations of metrics. Each "Bitslice" module is therefore instantiated sixteen times for a total of 256 metrics and receives a number "X". This number sets the internal calculations for each module which receives as input the coefficients $C_{j3}$ and $C_{j4}$ as well as the $D_j$ (State) functions supplied by the "Diff_Compo" modules 17.

Figure 6:
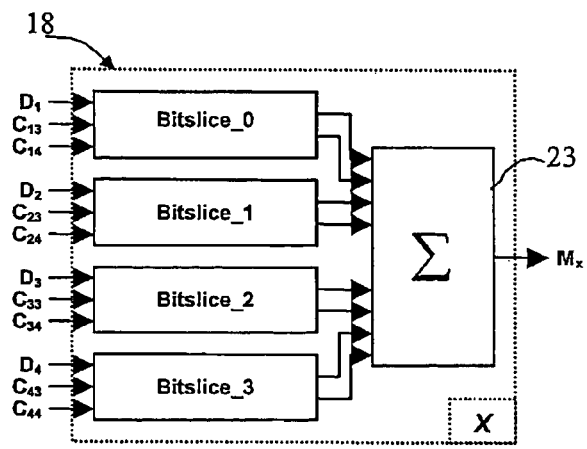
FIG. 6 is an internal diagrammatic view of the "Bitslice" module in FIG. 3.
Figure 7:
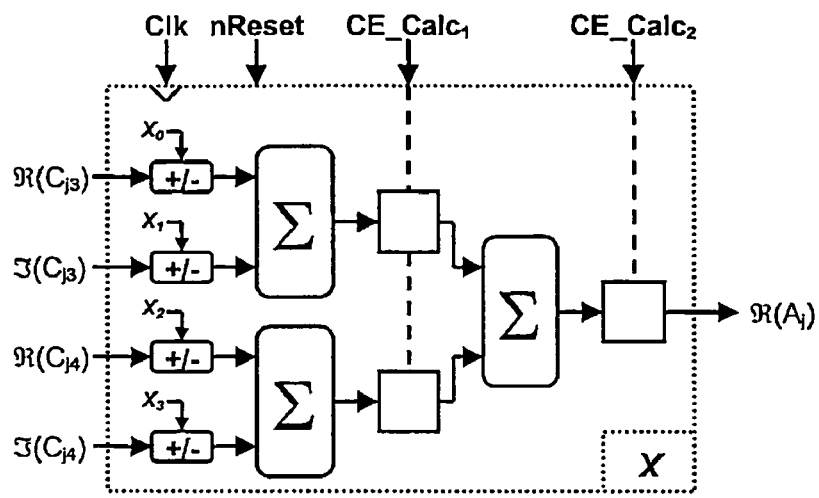
FIGS. 7 and 8 are internal diagrammatic views of the blocks for calculating the real and imaginary parts respectively of a component A in the "Bitslice" module.
Figure 8:
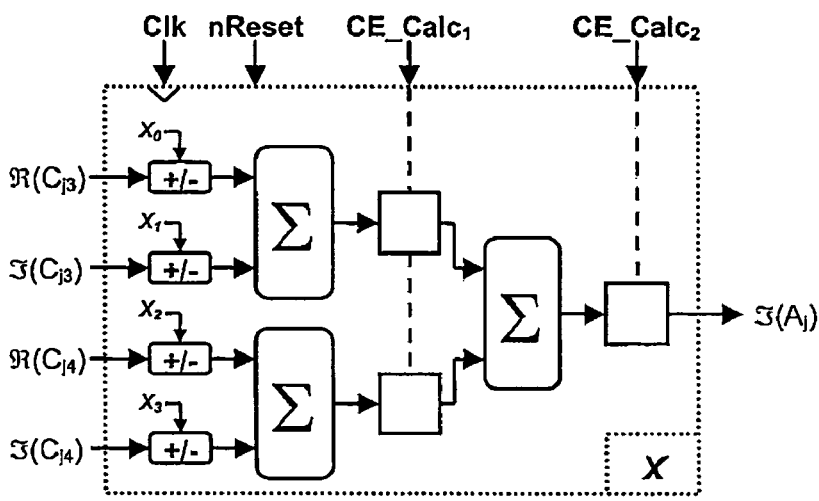

In FIG. 6 a "Bitslice" module is shown which, in fact, contains four sub-modules "Bitslice_0", "Bitslice_1", "Bitslice_2", and "Bitslice_3" fed by $D_j$, $C_{j3}$ and $C_{j4}$, j ranging from 1 to 4. Each sub-module generates a real part $I_{j1}$ and an imaginary part $I_{j2}$ as a function of the number X which is provided to it in the following manner:

$\{I_{j1} = \Re(C_{j3}((-1)^{\overline{x_0}} + i(-1)^{\overline{x_1}}) + C_{j4}(-1)^{\overline{x_2}} + i(-1)^{\overline{x_3}}) + D_j(State))^2$ $\{I_{j2} = \Im(C_{j3}((-1)^{\overline{x_0}} + i(-1)^{\overline{x_1}}) + C_{j4}((-1)^{\overline{x_2}} + i(-1)^{\overline{x_3}}) + D_j(State))^2$ According to FIG. 4, these calculations trigger the module 19 for calculating a component A from coefficients $C_{j3}$ and $C_{j4}$ according to the parameter X, the adder 20, the absolute value module 21 and the raising to the power deux 22. FIGS. 7 and 8 show respectively the calculation of the real and imaginary parts of the component A defined in the following manner:

$\Re(A_j) = (-1)^{\overline{x_0}} \Re(C_{j3}) + (-1)^{x_1} \Im(C_{j3}) +$
$(-1)^{\overline{x_2}} \Re(C_{j4}) + (-1)^{x_3} \Im(C_{j4})$ $\Im(A_j) = (-1)^{\overline{x_1}} \Re(C_{j3}) + (-1)^{\overline{x_0}} \Im(C_{j3}) +$
$(-1)^{\overline{x_3}} \Re(C_{j4}) + (-1)^{\overline{x_2}} \Im(C_{j4})$ The eight values $I_{j1}$ and $I_{j2}$ thus calculated are then introduced into the block 23 which consists of a series of seven synchronous sums between two coefficients divided in a pyramidal manner over three pipeline steps. The time to pass through this block is three clock cycles.

FIG. 4 illustrates the diagram of the calculation timings within the space-time decoder 14. Each block 17, 19-23, represents a function carried out. The length of each block indicates the time to pass through the latter. Each vertical dotted arrow (CE_Calc$_1$, CE_Calc$_2$, CE_Add, CE_Abs, CE_Square, CE_Square_2, CE_sum, CE_sum_2, CE_sum_3) represents a clock cycle. The overall time to pass through the decoding block ST is 9 clock cycles.

The 256 metrics calculated by the space-time decoder 14 are then sent in a sequential manner as sixteen packets of sixteen to the binary decoder 15. The latter implements a Viterbi algorithm with flexible input and hard output. The corresponding binary coder is that specified by the IEEE 802.11a standard. Only the efficiency ½ is used.

In a general manner, the convolutional encoder defined by the IEEE 802.11a standard uses a six-bit state coding. There are therefore 64 possible states for the coding. The binary decoder therefore comprises 64 states. For decoding, we take into consideration the transition bits for each group of four (corresponding to eight coded bits and therefore to 256 different codewords). The transition bits are bits provided to the convolutional coder in order to move from one lattice state to another. They are grouped by groups of four according to the invention.

There are thus sixteen possible transitions for each of the 64 states. Each of these states selects the most probable transition for each decision cycle. The decisions taken by all the states are stored and the path minimising the metrics is traced back. The transitions taken during this trace back constitute the decoded message.

Consequently, the binary decoder 15 carried out two complementary functions according to the invention:

Metrics management: This involves recovering continuously the flow of 16*16 metrics originating from the decoder ST 14, storing them and extracting the decisions from them;

Decision management: this involves receiving the decisions taken previously, storing them and deducing the most probable path from them; this module also takes the final decoding decisions and provides as output a serial binary flow of decoded bits.

Figure 9:
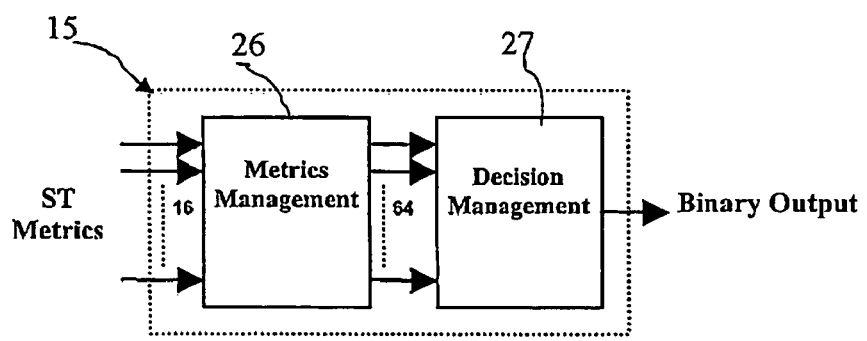
FIG. 9 is a diagrammatic view of the general architecture of the binary decoder integrated into the digital decoder according to the invention.

In FIG. 9, it is shown that the metrics management module 26 receives the 256 metrics by groups of sixteen, and generates 64 preliminary decisions to the decision management module 27 which in its turn generates a serial binary flow of decoded bits.

Figure 10:
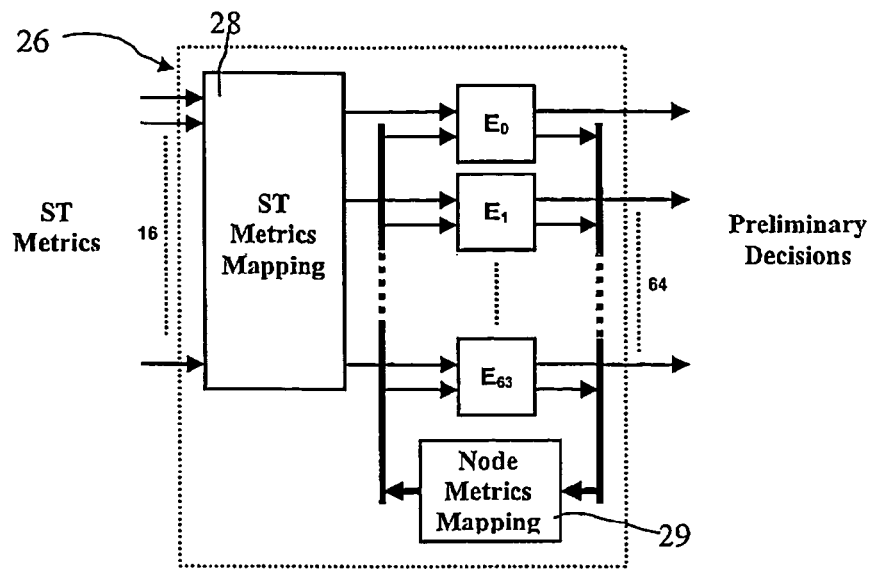
FIG. 10 is an internal diagrammatic view of the metrics management module within the binary decoder.

In FIG. 10 the internal architecture of the module 26 is shown. Each of the 64 state modules E0, . . . , E63 receives sixteen metrics as predefined in module 28 termed "mapping". A person skilled in the art, knowing the Viterbi algorithm, will be able with ease to constitute a "mapping" or wiring allowing metrics arriving from the space-time decoder to be directed to the corresponding state modules Ei. In fact, each metric is directed to a state module Ei given as a function of the value of the "State" variable. These metrics are used as transition probabilities and are termed branch metrics.

Figure 11:
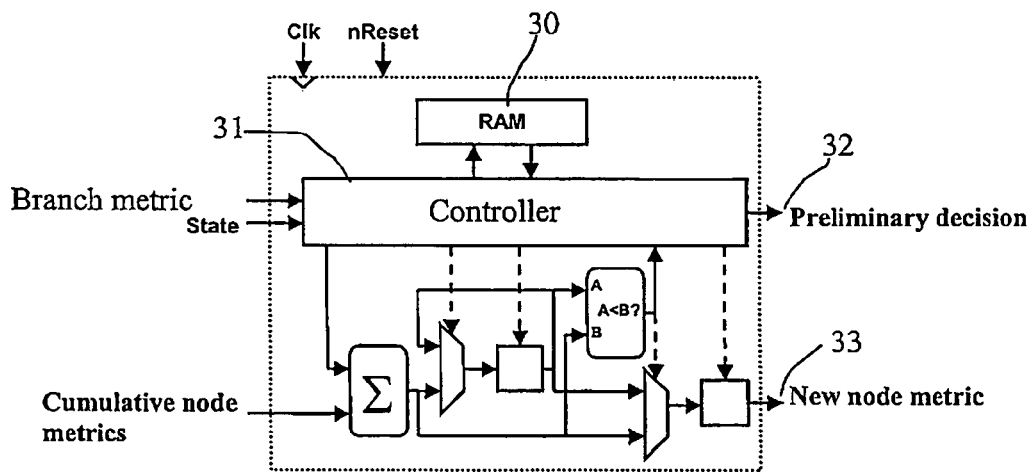
FIG. 11 is an internal diagrammatic view of a status module Ei of the metrics management module.

Each state module E0, . . . , E63 functions by period of sixteen clock cycles. During each period, in accordance with FIG. 11, it simultaneously carries out the following two operations:

storage, in a RAM memory 30, of the sixteen branch metrics, one per clock cycle, which are provided to it as input;

loading, one by one in an order defined by the state number which each state module Ei represents, of the branch metrics stored during the preceding period; each one of these metrics being added to a node metric provided as input ("Cumulative node metrics" input on FIG. 11). At the end of the period, and during the whole of the following period, the module in question provides as output the value and the number (cycle number from 0 to 15) corresponding to the smallest of the sums calculated during the past period. In fact, for the order of changing, for each state, its number (from 0 to 63) is coded in binary. From the binary code generated, equations according to the Viterbi algorithm provide the order in which the metrics must be read. This order takes into account the order in which the metrics were calculated in the space-time decoder.

For calculating the sums, each state module E0, . . . , E63 uses the values provided in series on the "Cumulative node metrics" input. These values represent the node metrics 33 output by the state modules E0 to E63 during the preceding period. They are stored and then distributed in a predefined manner within the module 29 termed node metrics "mapping", see FIG. 10. A person skilled in the art will understand with ease that this second "mapping" 29 is deduced from the "mapping" 28 according to the Viterbi algorithm. The numbering of the cycles within a period is effected by using the "State" variable as input to each state module E0, . . . , E63. A controller 31 in FIG. 11 manages the synchronisation of operations and provides at the end of each decision cycle a cumulative metric termed preliminary metric.

Figure 12:
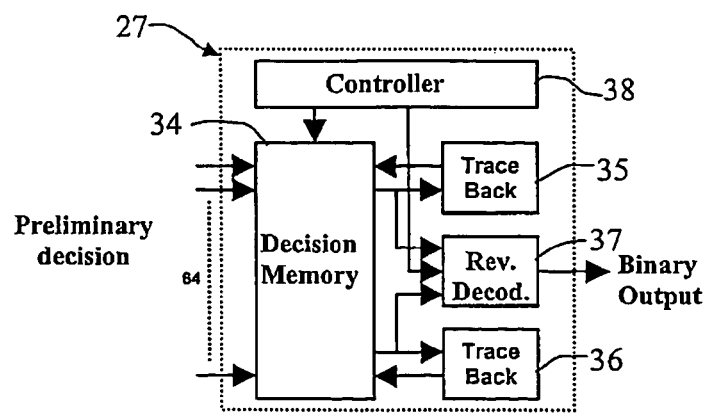
FIG. 12 is an internal diagrammatic view of the decision management module within the binary decoder.

The decision management module 27 of FIG. 9 is illustrated in more detail in FIG. 12. This module receives for each decision cycle 64 preliminary metrics which constitute the transition numbers. These decision vectors are stored in memory 34. The two "Trace_Back" blocks 35 and 36 loaded to run the memory 34 in reverse order to that of writing in order to trace back the most probable paths. When there is convergence, the data collected by the blocks 35 and 36 is transmitted to a block 37 termed "Reverse_Decoding" which is responsible for delivering the selected decisions in chronological order and passing the decoded bits in series to the output. A controller 38 manages the memory 34 and the output module 37.

Of course, the invention is not limited to the examples which have just been described and numerous adjustments can be made to these examples without exceeding the scope of the invention.

The invention claimed is:

1. A digital decoder for a transmitting-and-receiving-multi-antenna digital wireless transmission chain, for determining symbols transmitted in linear space-time coded transmission signals based on a convolutional binary coding, this digital decoder being fed by:

a received symbols signal vector Z, and a matrix C resulting from a product of a transmission channel matrix H and a space-time coding matrix M for the transmission comprising:

a comprehensive space-time decoder for calculating a metric between each possible codeword and the received symbols signal vector Z, and for generating as output all metrics thus calculated; and a binary decoder for determining, by using all the metrics generated as probabilities of transitions between states of the binary decoder, the most probable path taken during the convolutional binary coding, and for deducing from the symbols transmitted.

2. The digital decoder according to claim 1, characterized in that the space-time decoder comprises means for calculating all the metrics by successive groups, the metrics for each group being calculated in parallel and then transmitted to the binary decoder at each clock cycle.

3. The digital decoder according to claim 1, characterized in that when each possible codeword comprises eight bits ($b_0 b_1 b_2 b_3 b_4 b_5 b_6 b_7$), the 256 possible metrics are determined by calculating sixteen groups of sixteen metrics, each one according to the following definition:

$$\text{metric } (b_0 b_1 b_2 b_3 b_4 b_5 b_6 b_7) = \sum_{j=1}^{4} \left\| Z_j - \sum_{k=1}^{4} \left[ (-1)^{b_{2k-2}} + i(-1)^{b_{2k-1}} \right] C_{jk} \right\|^2.$$

4. The digital decoder according to claim 3, characterized in that to calculate the metrics, the space-time decoder comprises:

four identical "Diff-compo" modules to calculate in parallel and in a sequential manner four values Dj defined by:

$$D_j(\text{State}) =$$
$$C_{j1}\left((-1)^{\overline{State_0}} + i(-1)^{\overline{State_1}}\right) + C_{j2}\left((-1)^{\overline{State_2}} + i(-1)^{\overline{State_3}}\right) - Z_j,$$
$$j \in \{1, 2, 3, 4\},$$
with State = $(b_0 b_1 b_2 b_3)$;

sixteen "Bitslice" modules to calculate in parallel and in a sequential manner sixteen metrics, each metric then being defined by:

$$M_x(\text{State}) =$$
$$\sum_{j=1}^{4} \|D_j(\text{State}) + C_{j3}((-1)^{\overline{x_0}} + i(-1)^{\overline{x_1}}) + C_{j4}((-1)^{\overline{x_2}} + i(-1)^{\overline{x_3}})\|^2$$

with X being equal to $(b_4 b_5 b_6 b_7)$ and numbering each "Bitslice" module.

5. The digital decoder according to claim 4, characterized in that the space-time decoder also comprises a controller to manage the synchronization between the space-time decoder and the binary decoder, in order to generate the State signal.

6. The digital decoder according to claim 1, wherein the binary decoder is implemented according to a Viterbi algorithm with flexible input and hard output.

7. The digital decoder according to claim 6, characterized in that the transition bits are grouped by groups of four.

8. The digital decoder according to claim 6, characterized in that the binary decoder comprises a metrics management module to receive continuously all the metrics originating from the space-time decoder, store these metrics, and extract preliminary decisions from them.

9. The digital decoder according to claim 8, characterized in that the binary decoder also comprises a decision management module to receive said preliminary decisions, store these preliminary decisions, and deduce from them final decoding decisions.

10. The digital decoder according to claim 1, wherein said digital decoder is implemented over a programmable integrated circuit of the FPGA type, the calculations being executed in a synchronous manner using registers.

11. The digital decoder according to claim 1, wherein said digital decoder is adapted for a transmission chain comprising two transmitter antennas and two receiver antennas and for a transmission speed of 24 Mbits per second.

12. The digital decoder according to claim 1, wherein the convolutional binary coding comprises 64 states.

* * * * *

UNITED STATES PATENT AND TRADEMARK OFFICE
CERTIFICATE OF CORRECTION

PATENT NO.         : 7,796,701 B2
APPLICATION NO.    : 11/630627
DATED              : September 14, 2010
INVENTOR(S)        : Aubourg It is certified that error appears in the above-identified patent and that said Letters Patent is hereby corrected as shown below:

Col. 4 line 21, delete "$Y_1(S_1,S_2,S_3,S_4)Y_2(S_1,S_2,S_3,S_4)$" in the second row of the matrix directly adjacent to "Antenna2" and replace with --$Y_3(S_1,S_2,S_3,S_4)Y_4(S_1,S_2,S_3,S_4)$--

Signed and Sealed this
Twentieth Day of December, 2011

David J. Kappos
*Director of the United States Patent and Trademark Office*